(12) United States Patent
Eguchi

(10) Patent No.: US 6,952,373 B2
(45) Date of Patent: Oct. 4, 2005

(54) SEMICONDUCTOR DEVICE HAVING PLL-CIRCUIT

(75) Inventor: Fumio Eguchi, Tokya (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/941,996

(22) Filed: Sep. 16, 2004

(65) Prior Publication Data

US 2005/0030074 A1 Feb. 10, 2005

Related U.S. Application Data

(62) Division of application No. 10/748,205, filed on Dec. 31, 2003, now Pat. No. 6,807,117, which is a division of application No. 10/304,675, filed on Nov. 27, 2002, now Pat. No. 6,693,845.

(30) Foreign Application Priority Data

Nov. 28, 2001 (JP) ........................................ 2001-361961

(51) Int. Cl.$^7$ ................................................. G11C 7/00
(52) U.S. Cl. ........................................ 365/201; 365/233
(58) Field of Search .................................. 365/201, 233, 365/194; 327/156, 107, 119

(56) References Cited

U.S. PATENT DOCUMENTS

| | | | | |
|---|---|---|---|---|
| 5,946,244 A | * | 8/1999 | Manning ..................... | 365/194 |
| 6,078,533 A | * | 6/2000 | Lee ............................ | 365/194 |
| 6,400,625 B2 | * | 6/2002 | Arimoto et al. ............ | 365/201 |
| 6,512,707 B2 | * | 1/2003 | Miura et al. ................ | 365/194 |
| 6,807,116 B2 | * | 10/2004 | Yamazaki et al. .......... | 365/201 |

* cited by examiner

*Primary Examiner*—Anh Phung
(74) *Attorney, Agent, or Firm*—Rabin & Berdo, P.C.

(57) ABSTRACT

A semiconductor device includes a clock input terminal to which external clocks are supplied; a PLL circuit, which is supplied with the external clocks and generate first internal clocks; a logic circuit, which operates in synchronization with the internal clocks; and an internal counter, which counts the first internal clocks when the PLL circuit is tested. The internal counter is provided with an output terminal from which an output signal thereof is supplied to an external circuit.

2 Claims, 6 Drawing Sheets

SEMICONDUCTOR DEVICE HAVING PLL-CIRCUIT

This is a Divisional of U.S. application Ser. No. 10/748, 205, filed Dec. 31, 2003, now U.S. Pat. No. 6,807,117, issued on Oct. 19, 2004, which is a division of U.S. application Ser. No. 10/304,675, filed Nov. 27, 2002, now U.S. Pat. No. 6,693,845.

CROSS REFERENCE TO RELATED APPLICATION

This application claims the priority of Application No. 2001-361961, filed Nov. 28, 2001 in Japan, the subject matter of which is incorporated herein by reference.

TECHNICAL FIELD OF THE INVENTION

The present invention relates generally to a semiconductor integrated circuit including a PLL (Phase Locked Loop) circuit therein. More particularly, the present invention relates to a method of jitter measurement of a PLL circuit contained in a semiconductor integrated circuit.

BACKGROUND OF THE INVENTION

A conventional IC includes a PLL circuit, an external clock terminal, buffer circuits, a test terminal and a logic circuit. The logic circuit is provided with input terminals and output terminals. The PLL circuit generates master clocks based on the external clocks. The logic circuit performs a predetermined logical operation to an input signal, supplied to the input terminals, in synchronization with the master clock signals. Results of the logical operation by the logic circuit are outputted from the output terminals.

When a test is performed on the PLL circuit, an external logic analyzer is connected to the clock terminal and the test output terminal. In the test, external clocks are supplied to the clock terminal, and output clocks supplied from the test terminal are used to detect or measure the frequency and jitter of the master clock signal. In accordance with such detection results, a determination is made as to whether the PLL circuit has required characteristics.

"Jitter" is abrupt or spurious variations in the phase of the frequency modulation of a successive pulse reference to the phase of a continuous oscillator.

According to the above-described semiconductor IC, however, detected waveforms may become dull due to an impedance of a cable connected to the terminals and to the external analyzer. As a result, it is difficult to detect or measure the frequency and jitter of the PLL circuit reliably.

OBJECTS OF THE INVENTION

Accordingly, it is an object of the present invention to provide a semiconductor device in which the frequency and jitter of a PLL can be analyzed reliably.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor device includes a clock input terminal to which external clocks are supplied; a PLL circuit, which is supplied with the external clocks and generates first internal clocks, a logic circuit, which operates in synchronization with the internal clocks, and an internal counter, which counts the first internal clocks when the PLL circuit is tested. The internal counter is provided with an output terminal from which an output signal thereof is supplied to an external circuit.

According to a second aspect of the present invention, a semiconductor device includes a clock input terminal to which external clocks are supplied a PLL circuit, which is supplied with the external clocks and generates first internal clocks; a logic circuit, which operates in synchronization with the internal clocks, a test clock terminal to which test clocks are supplied from an external circuit, the test clock having a frequency with a predetermined phase difference from the external clocks, a flip-flop circuit, which is supplied with the test clocks and the first internal clocks to generate second internal clocks, and an internal counter, which counts the second internal clocks when the PLL circuit is tested. The internal counter is provided with an output terminal from which an output signal thereof is supplied to an external circuit.

According to a third aspect of the present invention, a semiconductor device, includes a clock input terminal to which external clocks are supplied, a PLL circuit, which is supplied with the external clocks and generates first internal clocks, a logic circuit, which operates in synchronization with the internal clocks, a test clock terminal to which test clocks are supplied from an external circuit, the test clock having a frequency with a predetermined phase difference from the external clocks, a flip-flop circuit, which is supplied with the test clocks and the first internal clocks to generate second internal clocks, an internal counter, which counts the second internal clocks when the PLL circuit is tested, and a selector, which selectively transfer one of the first clocks and the second clocks to the counter. The internal counter is provided with an output terminal from which an output signal thereof is supplied to an external circuit.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present invention. The following detailed description is, therefore, not to be taken in a limiting sense, and scope of the present invention is defined only by the appended claims.

Figure 1:
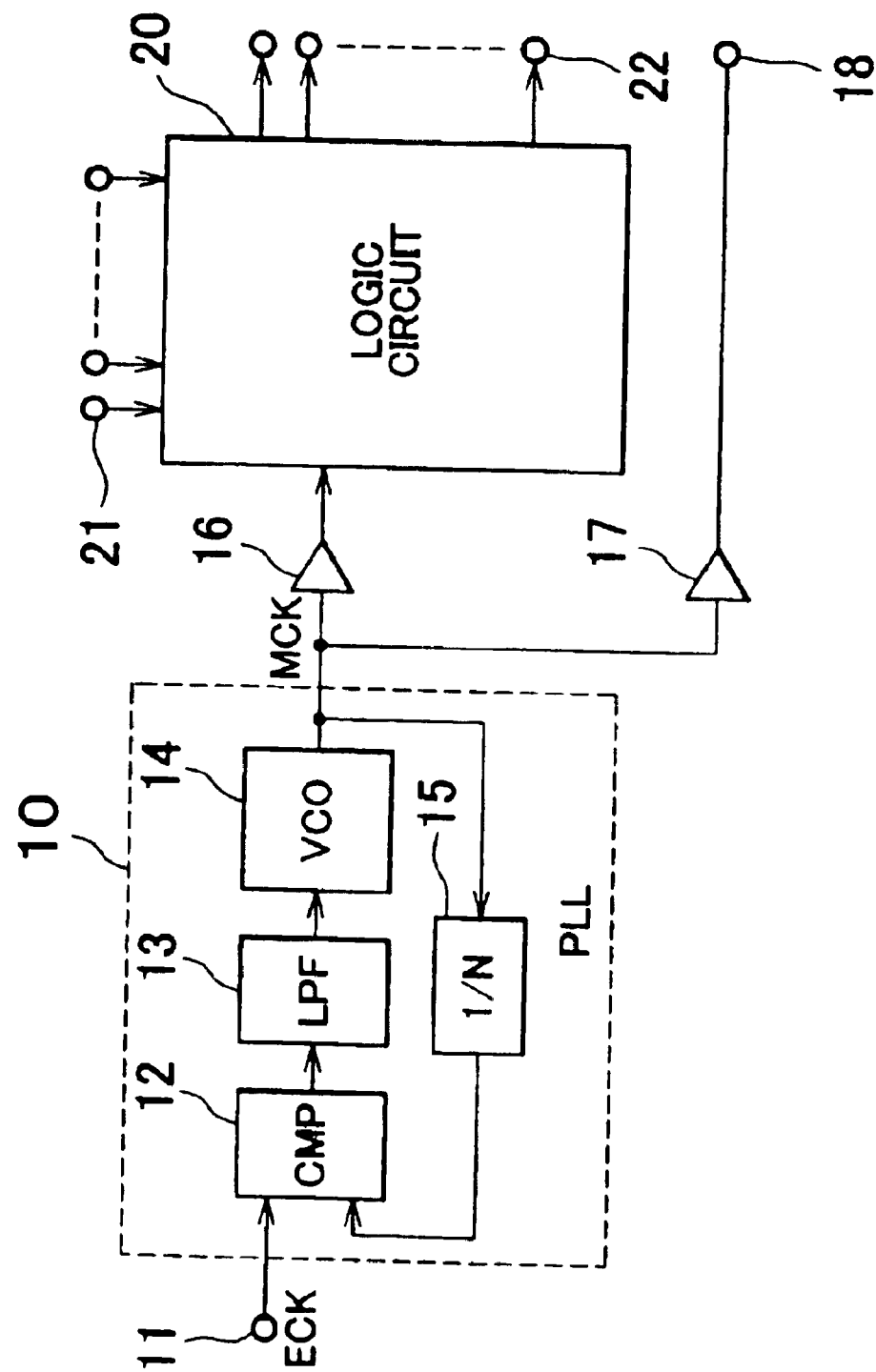
FIG. 1 is a block diagram illustrating a conventional semiconductor integrated circuit.

For better understanding of the present invention, a conventional technology is first described. FIG. 1 shows a block diagram showing a conventional IC, which includes a PLL circuit 10, an external clock terminal 11, buffer circuits 16 and 17, a test terminal 18 and a logic circuit 20. The logic circuit 20 is provided with input terminals 21 and output terminals 22.

The PLL circuit 10 includes a phase comparator 12, a low-pass filter 13, a voltage-controlled oscillator 14 and a frequency divider (frequency demultiplier) 15. Two of input terminals of the phase comparator 12 are connected to the external clock terminal 11 and an output terminal of the frequency divider 15. An output terminal of the frequency comparator 12 is connected to an input terminal of the low-pass filter 13. An output terminal of the low-pass filter 13 is coupled to an input terminal of the voltage-controlled oscillator 14. An output terminal of the voltage-controlled oscillator 14 is coupled to an input terminal of the frequency divider 15, an input terminal of the buffer 16 and an input terminal of the buffer 17. In the PLL 10, the external clocks ECK are multiplied in frequency by N to generate master clock signals MCK.

The voltage-controlled oscillator 14 generates the master clock signals MCK in accordance with a control voltage supplied from the low-pass filter 13. An output signal of the voltage-controlled oscillator 14 is divided in frequency to be 1/N to generate the master clock signal MCK. The phase comparator 12 compares the phases of the external clock ECK and the master clock MCK to provide an output signal corresponding to the phase difference between those clocks ECK and MCK. A higher frequency element is removed from the output signal of the phase comparator 12 to provide a control voltage, to be supplied to the voltage-controlled oscillator 14.

The above-described feedback operation is repeated, so that the frequency of the mater clock MCK is precisely matched to the "N" times of the external clock ECK.

The master clocks MCK are supplied through the buffer 16 to the logic circuit 20. The logic circuit 20 performs a predetermined logical operation on an input signal supplied to the input terminals 21, in synchronization with the master clock signals MCK. Results of the logical operation by the logic circuit 20 are outputted from the output terminals 22.

An output signal of the voltage-controlled oscillator 14 is supplied through the buffer 17 to the test output terminals 18. When a test is performed on the PLL circuit 10, an external logic analyzer is connected to the clock terminal 11 and the test output terminal 18. In the test, external clocks ECK are supplied to the clock terminal 11, and output clocks (MCK) supplied from the test terminal 18 are used to detect or measure the frequency and jitter of the master clock signal MCK. In accordance with such detection results, a determination is made as to whether the PLL circuit 10 has required characteristics.

According to the above-described semiconductor IC, however, detected waveforms may become dull due to an impedance of a cable connected to the terminals 11 and 18 and to the external analyzer (not shown). As a result, it is difficult to detect or measure the frequency and jitter of the PLL circuit reliably.

Figure 2:
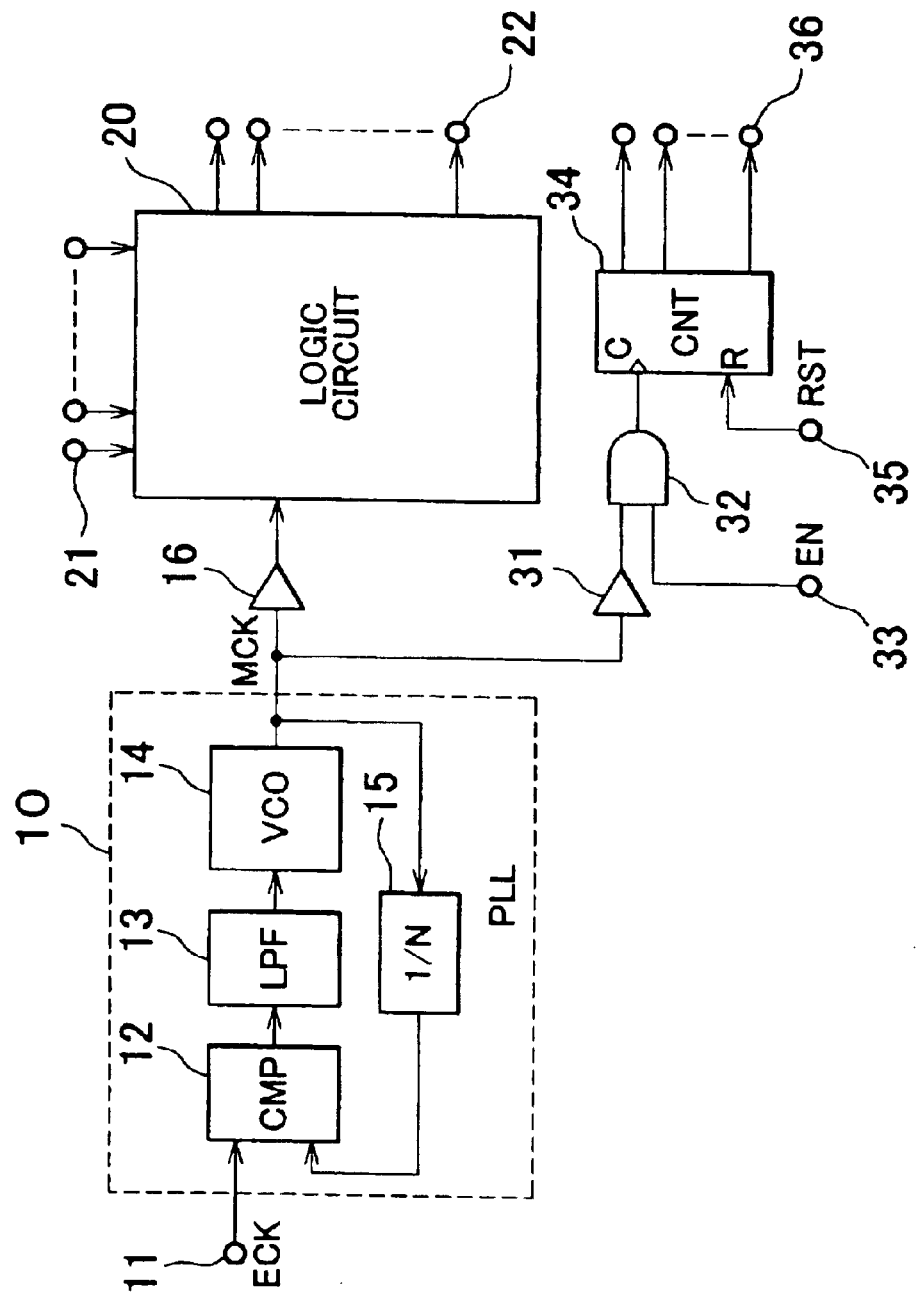
FIG. 2 is a block diagram illustrating a semiconductor integrated circuit according to a first preferred embodiment of the present invention.

FIG. 2 is a block diagram illustrating a semiconductor integrated circuit according to a first preferred embodiment of the present invention. In FIG. 2, the same and corresponding components to those in FIG. 1 are represented by the same reference numerals.

The semiconductor IC includes a PLL circuit 10, an external clock terminal 11, buffer circuits 16 and 31, a logic circuit 20, a control terminal 33, an AND gate 32, an internal counter 34, a reset terminal 35 and test output terminals 36. The logic circuit 20 is provided with input terminals 21 and output terminals 22.

The PLL circuit 10 includes a phase comparator 12, a low-pass filter 13, a voltage-controlled oscillator 14 and a frequency divider (frequency demultiplier) 15. Two of input terminals of the phase comparator 12 are connected to the external clock terminal 11 and an output terminal of the frequency divider 15. An output terminal of the frequency comparator 12 is connected to an input terminal of the low-pass filter 13. An output terminal of the low-pass filter 13 is coupled to an input terminal of the voltage-controlled oscillator 14. An output terminal of the voltage-controlled oscillator 14 is coupled to an input terminal of the frequency divider 15, an input terminal of the buffer 16 and an input terminal of the buffer 31. In the PLL 10, the external clocks ECK are multiplied in frequency by N to generate master clock signals MCK.

The voltage-controlled oscillator 14 generates the master clock signals MCK in accordance with a control voltage supplied from the low-pass filter 13. An output signal of the voltage-controlled oscillator 14 is divided in frequency to be 1/N to generate the master clock signal MCK. The phase comparator 12 compares the phases of the external clock ECK and the master clock MCK to provide an output signal corresponding to the phase difference between those clocks ECK and MCK. A higher frequency element is removed from the output signal of the phase comparator 12 to provide a control voltage, to be supplied to the voltage-controlled oscillator 14.

The above-described feed-back operation is repeated, so that the frequency of the mater clock MCK is precisely matched to the "N" times of the external clock ECK.

The master clocks MCK are supplied through the buffer 16 to the logic circuit 20. The logic circuit 20 performs a predetermined logical operation on an input signal, supplied to the input terminals 21, in synchronization with the master clock signals MCK. Results of the logical operation by the logic circuit 20 are outputted from the output terminals 22.

An output terminal of the buffer 31 is connected to an input terminal of the AND gate 32. The other input terminal of the AND gate is connected to the control gate 33, to which an enable signal EN is supplied. An output terminal of the AND gate 32 is connected to a clock terminal "C" of the internal counter 34. A reset terminal of the internal counter 34 is connected to the reset terminal 35, to which a reset signal RST is supplied.

The counter 34 is reset to "0" when a high level "H" of the reset signal RST is supplied to the reset terminal "R". The counter 34 counts the number of pulse signals supplied to the clock terminal "C" one by one, when a low level "L" of the reset signal RST is supplied to the reset terminal "R". A count value of the internal counter 34 is outputted from the test output terminals 36. The count value is a binary digit.

Next, the operation for measuring the frequency of the master clock signal MCK will be described. First, the clock terminal 11, the control terminal 33, the reset terminal 35 and the test output terminals 36 are connected to an external logic tester, which is not shown. When the tester supplies an external clock ECK to the clock terminal 11, the PLL circuit 10 starts operating. At this time, the control terminal 33 is supplied with a low level "L" of the enable signal EN and the reset terminal 35 is supplied with a high level "H" of the reset signal RST. The internal counter 34 is reset to zero. A low level signal "L" is supplied to the clock terminal "C", so that the internal counter 34 does not operate.

Next, the reset signal RST is turned to "L", so that the internal counter 34 is able to start counting. After that, the enable signal EN is turned to "H" in synchronization with the external clock signal ECK during "M" cycles of the external clock signal ECK. The master clock signal MCK is supplied through the AND gate 32 to the clock terminal "C of the counter 34.

When the external clock signal ECK has spent "M" cycles and the enable signal EN is turned to "L", a counted value at the test output terminal 36 is detected. When the counted value is "N×M", the PLL circuit 10 is judged to be operating normally.

According to the above-described first preferred embodiment, the counter 34 counting the master clock signal MCK is equipped in the semiconductor device, so that it is not required to output the master clock signal MCK to an external circuit when a test of the PLL circuit 10 is carried out. Therefore, the oscillating frequency of the PLL circuit 10 can be measured or analyzed precisely and reliably.

Figure 3:
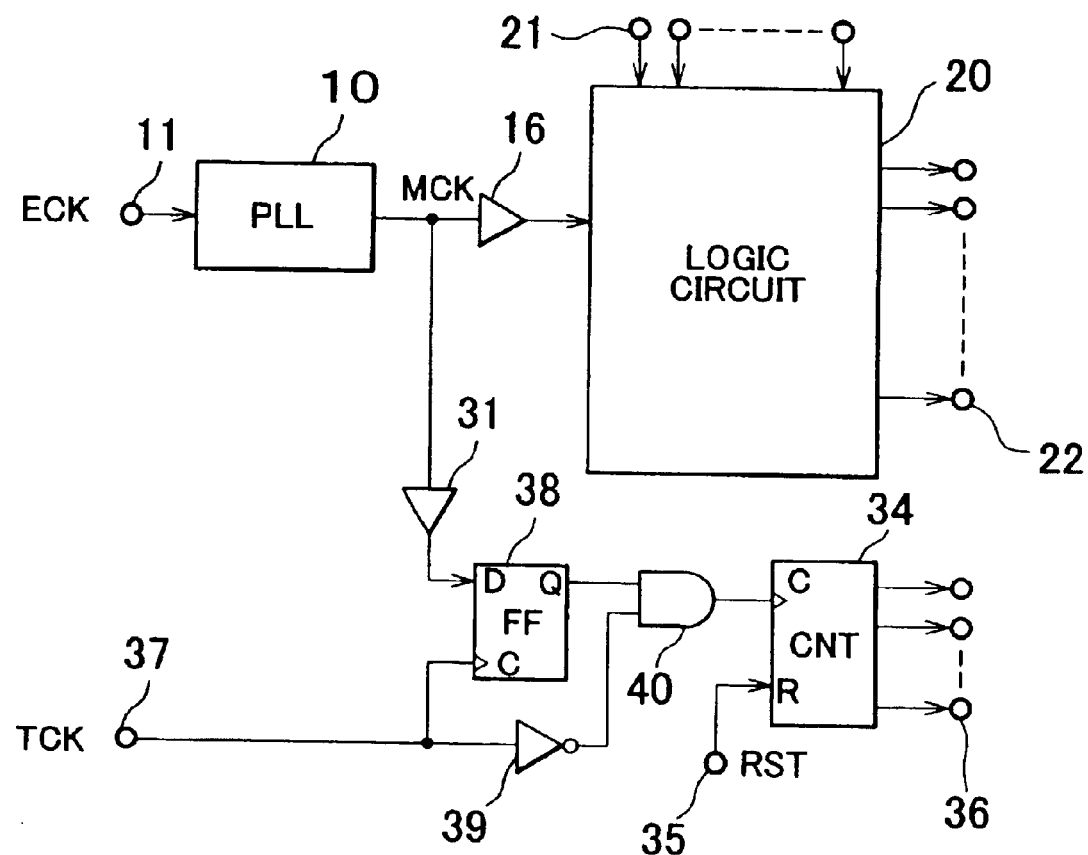
FIG. 3 is a block diagram illustrating a semiconductor integrated circuit according to a second preferred embodiment of the present invention.

FIG. 3 is a block diagram illustrating a semiconductor integrated circuit according to a second preferred embodiment of the present invention. In FIG. 3, the same and corresponding components to those in FIGS. 1 and 2 are represented by the same reference numerals. The semiconductor IC according to this embodiment includes a circuit for measuring jitter of a PLL circuit.

The semiconductor IC includes a PLL circuit 10, an external clock terminal 11, buffer circuits 16 and 31, a logic circuit 20, a test clock terminal 37, an AND gate 40, an internal counter 34, a reset terminal 35, test output terminals 36, a flip-flop circuit 38 and an inverter 39. The logic circuit 20 is provided with input terminals 21 and output terminals 22.

The PLL circuit 10 generates master clock signal MCK based on an external clock signal ECK, in the same manner as the first preferred embodiment. The master clocks MCK are supplied through the buffer 16 to the logic circuit 20. The logic circuit 20 performs a predetermined logical operation to an input signal, supplied to the input terminals 21, in synchronization with the master clock signals MCK. Results of the logical operation by the logic circuit 20 are outputted from the output terminals 22.

An output terminal of the buffer 31 is connected to a data terminal "D" of the flip-flop circuit 38. The test clock terminal 37 is connected to a clock terminal "C" of the flip-flop circuit 38 and an input terminal of the inverter 39. Two of input terminals of the AND gate 40 are connected to an output terminal "Q" of the flip-flop circuit 38 and to an output terminal of the inverter 39. An output terminal of the AND gate 40 is connected to a clock terminal "C" of the internal counter 34. A reset terminal of the internal counter 34 is connected to the reset terminal 35, to which a reset signal RST is supplied.

The counter 34 is reset to "0" when a high level "H" of the reset signal RST is supplied to the reset terminal "R". The counter 34 counts the number of pulse signals supplied to the clock terminal "C" one by one, when a low level "L" of the reset signal RST is supplied to the reset terminal "R".

A count value of the internal counter 34 is outputted from the test output terminals 36. The count value is a binary digit.

The test clock terminal 37 is supplied with a test clock signal TCK, having a predetermined phase difference from the external clock signal ECK, from an external tester circuit.

The flip-flop circuit 38 holds a signal at the data terminal "D" and outputs it from the output terminal "Q", when the test clock signal TCK supplied to the clock terminal "C" is turned to high or rising up.

Figure 4:
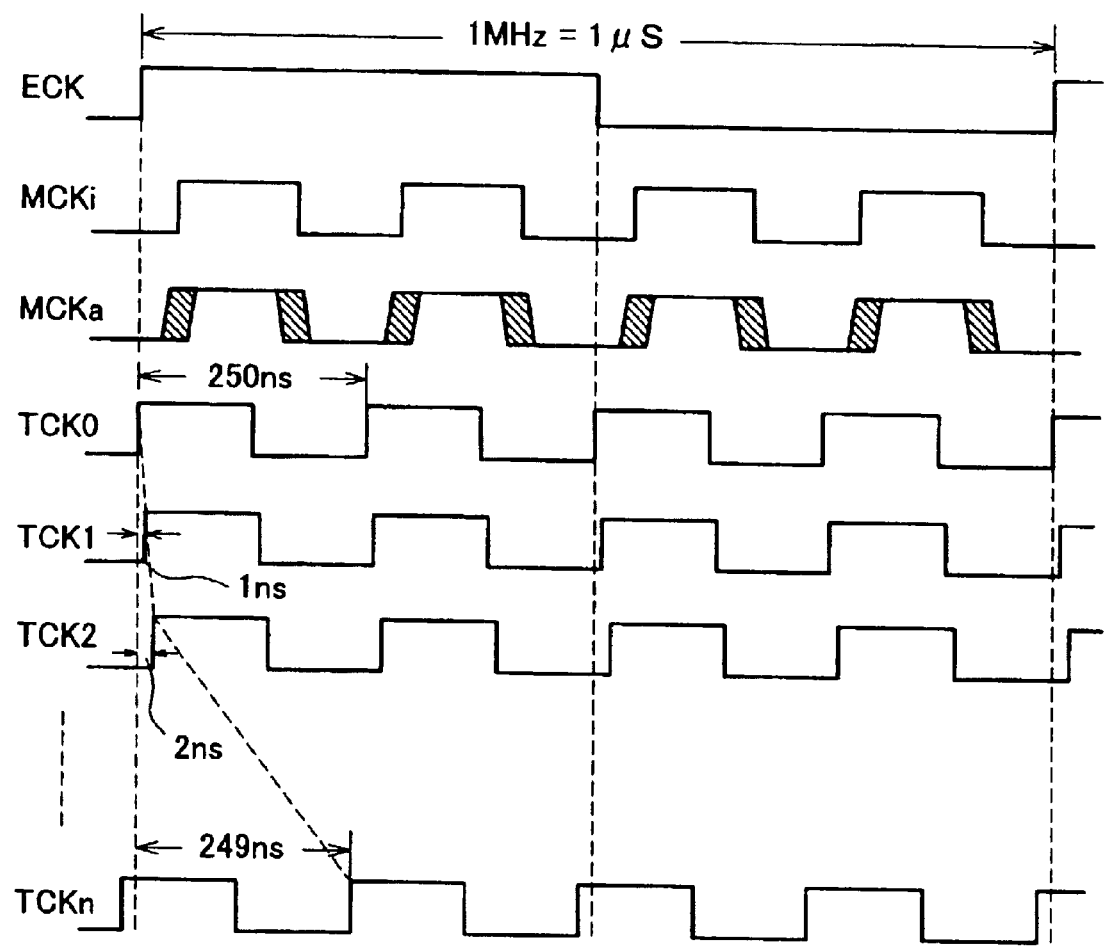
FIG. 4 is a timing chart showing the operation of the second preferred embodiment.
Figure 5:
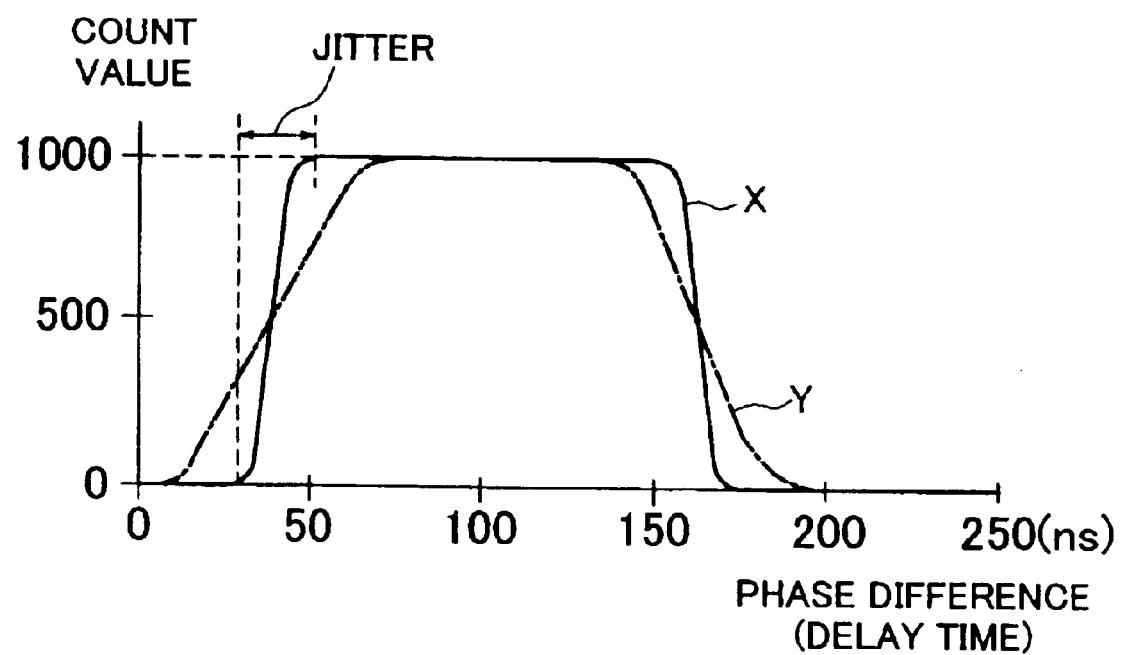
FIG. 5 is a graph showing the operation of the second preferred embodiment.

FIG. 4 is a timing chart showing the operation of the second preferred embodiment. FIG. 5 is a graph showing the operation of the second preferred embodiment. For easy understanding it assumed that the external clock signal ECK and the master clock signal MCK have frequencies of 1 MHz and 4 MHz, respectively.

In operation of jitter measurement, first, the clock terminal 11, the test clock terminal 37, the reset terminal 35 and the test output terminals 36 are connected to an external logic tester, which is not shown. When the tester supplies an external clock ECK of 1 MHz to the clock terminal 11, the PLL circuit 10 starts operating. At this time, the test clock terminal 37 is supplied with a low level "L" of the test clock signal TCK. The reset terminal 35 is supplied with a high level "H" of the reset signal RST. The internal counter 34 is reset to zero.

Next, the reset signal RST is turned to "L", so that the internal counter 34 is able to start counting. After that, for example, a thousand pulses of the test clock signal TCKi (i=0 to "n", "n" may be two-hundred and forty-nine) are inputted continuously in synchronization with the external clock signal ECK. The test clock signal TCKi has a delay time of i(ns) from the external clock signal ECK. The test clock signal TCK1 may be 1 MHz as well as the external clock signal ECK, although it is 4 MHz in FIG. 4.

When the test clock signal TCKi is turned to high, the current status of the master clock signal MCK, "H" or "L", is held by the flip-flop circuit 38, and is supplied to the input terminal of the AND gate 40. At this time, the inverter 39 outputs a low level "L" of signal, so that the AND gate 40 outputs an "L" level signal.

When the test clock signal TCKi is turned to low, the output of the inverter 39 is turned to "H". Therefore, if a high level "H" of the master clock signal MCK is held by the flip-flop circuit 38, the AND gate 40 supplies an output signal of level "H". The internal counter 34 counts up one. On the other hand, if a low level "L" of the master clock signal MCK is held by the flip-flop circuit 38, the AND gate 40 supplies an "L" level output signal. The count value of the internal counter 34 does not change.

After a thousand pulses of the test clock signal TCKi are entered, the count value of the internal counter 34 is read out and recorded. Based on such a count value, a probability that the master clock signal MCK is high "H" after a period of i(ns) since the external clock signal Eck is turned to high is calculated.

The above operation is repeated 250 times while the delay time of the test clock signal TCKi is changed 0 ns to 249 ns. In FIG. 5, a horizontal axis indicates the delay time of the test clock signal TCKi, and a vertical axis indicates count values of the internal counter 34. A range of jitter of the PLL circuit 10 is indicated by an intermediate value between count values of 0 to 1000. In FIG. 5, a solid line "X indicates a case of smaller jitter, while a dashed line "Y" indicates a case of larger jitter.

According to the above-described second preferred embodiment, the counter 34 counting the test clock signal TCK is equipped inside the semiconductor device, so that it is not required to output the master clock signal MCK to an external circuit when a jitter test of the PLL circuit 10 is carried out. Therefore, the jitter of the PLL circuit 10 can be measured or analyzed precisely and reliably.

Figure 6:
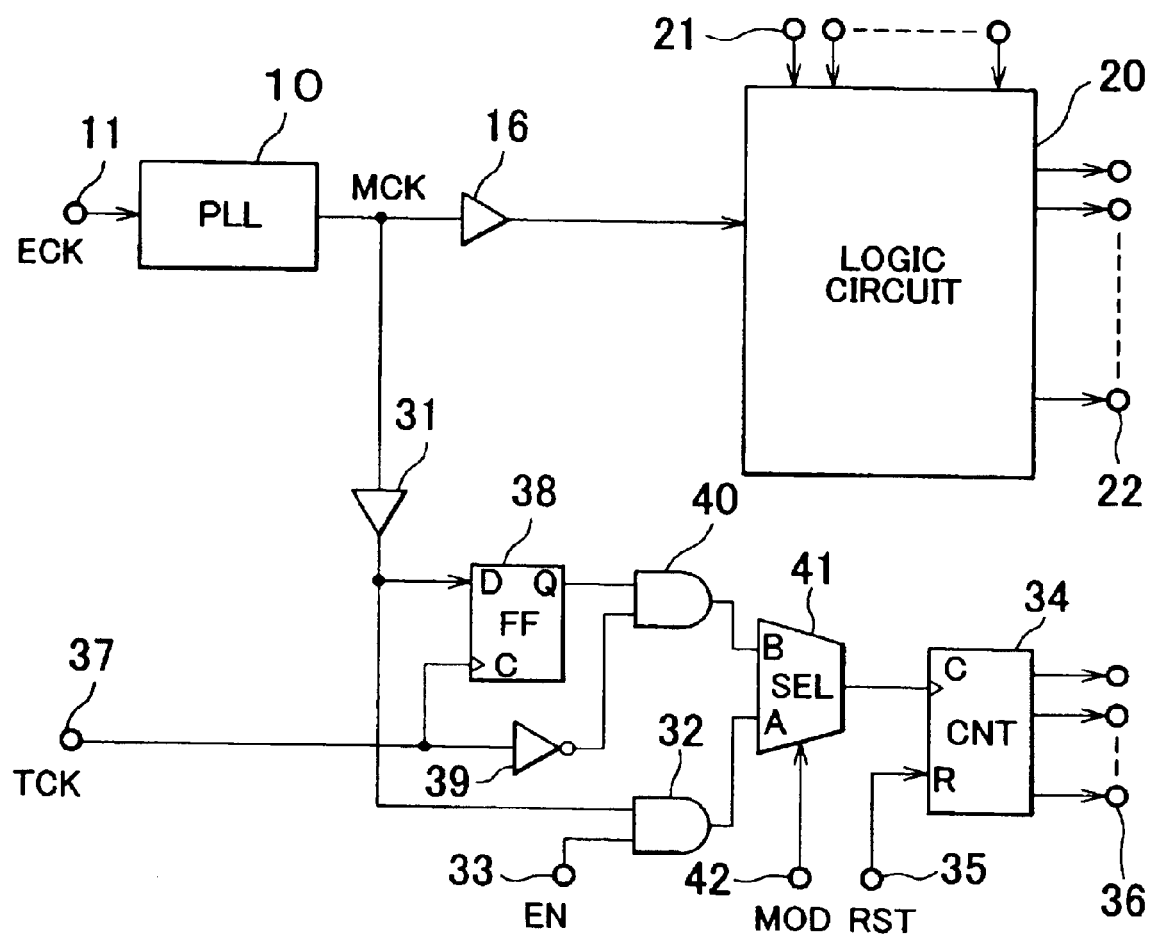
FIG. 6 is a block diagram illustrating a semiconductor integrated circuit according to a third preferred embodiment of the present invention.

FIG. 6 is a block diagram illustrating a semiconductor integrated circuit according to a third preferred embodiment of the present invention. In FIG. 6, the same and corresponding components to those in FIGS. 1, 2 and 3 are represented by the same reference numerals. The semiconductor IC according to this embodiment includes a circuit for measuring both of oscillating frequency and jitter of a PLL circuit.

The semiconductor IC includes a PLL circuit 10, an external clock terminal 11, buffer circuits 16 and 31, a logic circuit 20, a test clock terminal 37, an AND gates 32 and 40, a control terminal 33, an internal counter 34, a reset terminal 35, test output terminals 36, a flip-flop circuit 38, an inverter 39, a selector 41 and a mode selecting terminal 42. The logic circuit 20 is provided with input terminals 21 and output terminals 22.

The PLL circuit 10 generates master clock signal MCK based on an external clock signal ECK, in the same manner as the first preferred embodiment. The master clocks MCK are supplied through the buffer 16 to the logic circuit 20. The logic circuit 20 performs a predetermined logical operation an input signal supplied to the input terminals 21, in synchronization with the master clock signals MCK. Results of the logical operation by the logic circuit 20 are outputted from the output terminals 22.

An output terminal of the buffer 31 is connected to a data terminal "D" of the flip-flop circuit 38 and to an input terminal of the AND gate 32. Another input terminal of the AND gate 32 is connected to the control terminal 33. The test clock terminal 37 is connected to a clock terminal "C" of the flip-flop circuit 38 and an input terminal of the inverter 39. Two of input terminals of the AND gate 40 are connected to an output terminal "Q" of the flip-flop circuit 38 and to an output terminal of the inverter 39. Output terminals of the AND gates 23 and 40 are connected to input terminals "A" and "B" of the selector 41. An output terminal of the selector 41 is connected to a clock terminal "C" of the internal counter 34. A reset terminal of the internal counter 34 is connected to the reset terminal 35, to which a reset signal RST is supplied.

The selector 41 selects one of the input terminals "A" and "B" to transmit to the counter 34 in accordance with a mode selection signal MOD, supplied to the mode selecting terminal 42. When the selector 41 selects the input terminal "A", a frequency test of the PLL circuit 10 is carried out in the same manner as the first preferred embodiment. On the other hand, when the selector 41 selects the input terminal "B", a jitter test of the PLL circuit 10 is carried out in the same manner as the second preferred embodiment.

According to the third preferred embodiment, the internal counter 34 is used both for a frequency test and a jitter test of the PLL circuit 10, so that those test can be carried out precisely without increasing the size of circuitry.

The present invention is not limited by the above-described embodiments as follows:

a) The structure of a PLL circuit is not limited by that shown in FIG. 2.

b) Reverse logic can be applied to signals such as the enable signal EN and the reset signal RST.

c) The multiplying factor of the PLL circuit 10 can be other than "N".

d) Although in FIGS. 3 and 5, the number of the master clock signal MCK at high level "H" is counted at a timing when the test clock signal TCK is turned to high, the number of the master clock signal MCK at high level "H" may be counted at a timing when the test clock signal TCK is turned to low. Further, the number of the master clock signal MCK at low level "L" may be counted instead of "H".

e) In FIG. 4, the delay time of the test clock signal TCKi and number of cycle may be changed.

f) In FIGS. 2, 3 and 5, input and output terminals for use in a test, and input and output terminals for normal operation are independently provided. However, those input and output terminals may be used both for test and normal operations.

What is claimed is:

1. A semiconductor device, comprising:

a clock input terminal to which external clocks are supplied;

a PLL circuit, which is supplied with the external clocks and generates first internal clocks;

a logic circuit, which operates in synchronization with the internal clocks;

a test clock terminal to which test clocks are supplied from an external circuit, the test clock having a frequency with a predetermined phase difference from the external clocks;

a flip-flop circuit, which is supplied with the test clocks and the first internal clocks to generate second internal clocks;

an internal counter, which counts the second internal clocks when the PLL circuit is tested; and a selector, which selectively transfer one of the first clocks and the second clocks to the counter, wherein the internal counter is provided with an output terminal from which an output signal thereof is supplied to an external circuit.

2. A semiconductor device according to claim 1, further comprising:

a control terminal to which a control signal is supplied from an external circuit when a frequency test is started;

a first logic gate, which is supplied with the first internal clocks and the control signal;

a reset terminal to which a reset signal is supplied from an external circuit to the counter; and a second logic gate, which is supplied with the second internal clocks and the test clocks, wherein the counter operates in accordance with an output signal of the selector and the reset signal.

* * * * *